United States Patent [19]

Chien et al.

[11] Patent Number: 5,624,870
[45] Date of Patent: Apr. 29, 1997

[54] METHOD OF CONTACT PLANARIZATION

[75] Inventors: Sun-Chieh Chien; Yu-Ju Liu, both of Hsinchu, Taiwan

[73] Assignee: United Microelectronics Corporation, Hsinchu, Taiwan

[21] Appl. No.: 405,489

[22] Filed: Mar. 16, 1995

[51] Int. Cl.⁶ .................................................. H01L 21/28
[52] U.S. Cl. ........................ 438/653; 438/655; 438/645; 438/643
[58] Field of Search ........................... 437/200, 228, 437/190, 192, 193, 195, 231

[56] References Cited

U.S. PATENT DOCUMENTS

| | | | |
|---|---|---|---|
| 4,624,864 | 11/1986 | Hartmann | 437/193 |
| 4,800,176 | 1/1989 | Kokumu et al. | 437/195 |
| 4,818,723 | 4/1989 | Yen | 437/192 |
| 4,829,024 | 5/1989 | Klein et al. | 437/192 |
| 4,833,519 | 5/1989 | Kawano et al. | 437/195 |
| 4,884,123 | 11/1989 | Dixit et al. | 437/190 |
| 5,084,413 | 1/1992 | Fujita et al. | 437/192 |
| 5,183,781 | 2/1993 | Nakano | 437/193 |
| 5,275,715 | 1/1994 | Tuttle | 437/192 |
| 5,308,795 | 5/1994 | Hawley et al. | 437/192 |
| 5,429,990 | 7/1995 | Liu et al. | 437/231 |

OTHER PUBLICATIONS

S. Wolf et al "Silicon Processing for the VLSI Era, vol. 1", Lattice Press, 1986, pp. 531–534, 555–560.

*Primary Examiner*—George Fourson
*Assistant Examiner*—Thomas G. Biloceau
*Attorney, Agent, or Firm*—Townsend and Townsend and Crew LLP

[57] ABSTRACT

A method of planarizing an electrical contact region in a silicon substrate uses spin-on-glass or polysilicon as plug material (42) to fill a contact hole (34). A device or doped region (31) is formed at the surface of the substrate (30) and an insulating layer (33) is formed over the substrate so that the entire doped region is covered by the insulating layer. The contact hole is then formed through the insulating layer to expose a portion of the doped region. To increase the conductivity of the doped region through the contact hole, a filler layer of either spin-on-glass or polysilicon, thick enough to substantially fill the contact hole, is formed over the insulating layer. The filler layer is then etched away from the portions around the contact hole by a conventional dry or wet oxide etching process.

22 Claims, 5 Drawing Sheets

METHOD OF CONTACT PLANARIZATION

FIELD OF THE INVENTION

The present invention relates to the processing of metal contacts in a semiconductor device, and more particularly to a method of planarizing an electrical contact region on a silicon substrate.

BACKGROUND OF THE INVENTION

In the semiconductor industry, there is a trend towards fabricating chips with both higher device density and more complex chip functions. Accordingly, the size of semiconductor devices has been greatly reduced. One of the problems caused by this size reduction is that the width of the contact openings between the device or doped regions of a substrate and the overlying conducting layer has been decreased. Narrow contact openings have a relatively large resistance to current, which makes it more difficult to form reliable electrical contacts between the doped regions and the conducting layer, thereby making it more difficult to fabricate reliable semiconductor chips.

The process of forming electrical contacts in a semiconductor device involves etching a dielectric layer overlying the doped regions of a substrate to form contact holes through the dielectric layer and thus expose a portion of each doped region. The dielectric layer is then covered with a conducting layer, such as aluminum, to electrically contact the doped regions through the contact holes. In order to reliably contact these doped regions, the conducting layer is typically sputtered over the dielectric layer and the contact holes. Narrow contact openings, however, result in smaller contact hole areas, thus creating vertical sidewalls in the contact holes. The vertical sidewalls of contact holes generate poor step coverage of the conducting layer because the metal thickness in the contact holes is generally greater than the metal thickness on the top of the dielectric layer. This causes higher contact resistance or even an open circuit between the conducting layer and the doped regions of the substrate.

The above problems have been addressed by filling the contact holes with conducting or plug materials, such as tungsten. This "planarization" of the contact region has been disclosed in U.S. Pat. Nos. 4,884,123 and 4,994,410, the complete disclosure of which is incorporated herein by reference. The manufacturing steps for a typical process utilizing tungsten plug materials are depicted in FIGS. 1A–1E.

Referring to FIG. 1A, a doped region 12, either N-type or P-type, is formed in a silicon substrate 10 by diffusion, which forms a metallurgical junction with substrate 10. An insulating layer 14 comprising an oxide; e.g., nitride or the like, is formed over substrate 10. A contact hole 15 is then formed by chemically etching a patterned opening through insulating layer 14. A layer of titanium 16 is deposited over the surface of insulating layer 14 so that titanium layer 16 extends into contact hole 15 to contact the exposed portion of doped region 12. A titanium-tungsten layer 18 is deposited over titanium layer 16 as a barrier layer.

Referring next to FIG. 1B, the structure of FIG. 1A is then subjected to heating in a nitrogen atmosphere to cause both the formation of a titanium silicide layer 13 at the titanium-silicon interface and the formation of a titanium nitride layer 17 at the interface of the titanium-tungsten and titanium layers 18, 16. Note that the titanium nitride and titanium-tungsten layers both function as a barrier.

Turning to FIG. 1C, after the thermal process, a thick blanket layer of tungsten is deposited over the titanium-tungsten layer 18. The tungsten layer is thick enough to completely fill opening 15. All of the tungsten layer deposited over insulating layer 14 is then substantially removed by an etching process to leave only tungsten plug 19 filled in contact hole 15. Tungsten plug 19 planarizes the contact hole, thereby providing the electrical connection between the doped region and the conducting layer.

Referring to FIG. 1D, a layer of aluminum 20 is applied to the surface of the structure by sputtering to contact tungsten plug 19. Note that aluminum layer 19 does not contact doped region 12 directly, but is electrically connected to doped region 12 through tungsten plug 19, barrier layers 16, 17 and 18 and titanium silicide layer 13.

One drawback with the above process is that the deposition and etching of the tungsten layer increases both the process complexity and the manufacturing cost. In order to form and then etch the tungsten layer, more steps must be added to the manufacturing process, and these extra steps are not consistent with the conventional process of fabricating semiconductor devices. For example, the etching process of a tungsten layer is typically performed by plasma etching using $SF_6$ or $CBrF_3$ gases, which requires additional instruments to perform the etching work. These additional instruments are expensive and the extra process steps are not easy to control.

SUMMARY OF THE INVENTION

The present invention is directed to a method of planarizing an electrical contact region on a substrate, such as a silicon substrate that forms a portion of a semiconductor device. A device or doped region is provided at the surface of the substrate and an insulating layer is formed over the substrate so that the entire doped region is covered by the insulating layer. A contact region or hole is then formed through the insulating layer to expose a portion of the doped region. To increase the conductivity of the doped region, the contact hole is filled with a filler material, such as spin-on-glass or polysilicon. A conducting layer is then formed over the insulating layer and the filler material in the contact hole so that the doped region is electrically coupled to the conducting layer. One advantage of the above method is that both spin-on-glass and polysilicon can be filled into the contact hole with conventional deposition and etching removal processes. These processes are relatively inexpensive and they can be inserted into a conventional semiconductor manufacturing process without adding many extra, complicated steps to the overall process.

In one embodiment, a polysilicon layer is formed over the insulating layer, and a metal layer, such as titanium, is formed over the polysilicon layer after the contact hole has been formed through the insulating layer. The entire device is subject to rapid thermal annealing in a nitrogen containing atmosphere to form a titanium nitride layer and a titanium silicide layer under the titanium nitride layer. The nitride layer prevents doped species and/or silicon from diffusing from the substrate to the conductive layer and the silicide layer helps to reduce the electrical resistance of the contact hole. After these steps, a filling layer of either spin-on-glass or polysilicon is formed over the nitride layer. The filling layer is thick enough to substantially fill the contact hole. This layer is then etched away from the portions around the contact hole by a conventional dry or wet oxide etching process.

In another embodiment, a barrier layer is formed over the polysilicon and titanium layers so that the titanium layer will not react with nitrogen during the thermal annealing step.

The entire device is then subject to rapid thermal annealing as described above. Since the titanium layer cannot react with the nitrogen, a portion of the polysilicon layer at the bottom of the contact hole is completely consumed, forming an additional titanium silicide layer at the surface of the doped region. This additional titanium silicide layer further reduces the electrical contact resistance between the doped region and the conducting layer.

BRIEF DESCRIPTION OF THE DRAWINGS

Other objects, features and advantages of the present invention will become apparent by the following detailed description of the preferred, but non-limiting embodiment, with reference to the accompanied drawings, wherein.

DESCRIPTION OF THE PREFERRED EMBODIMENTS

Figure 1A:
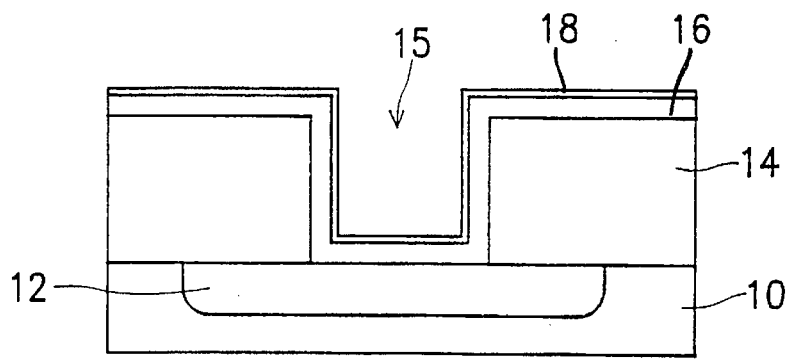
FIGS. 1A through 1D illustrate, in cross-section, process steps according to the prior art.
Figure 1B:
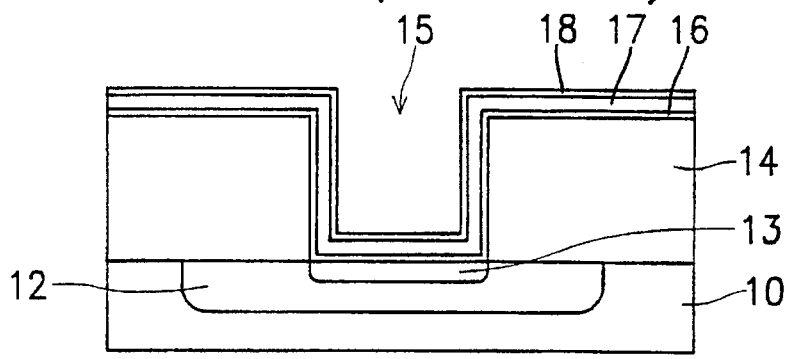
Figure 1C:
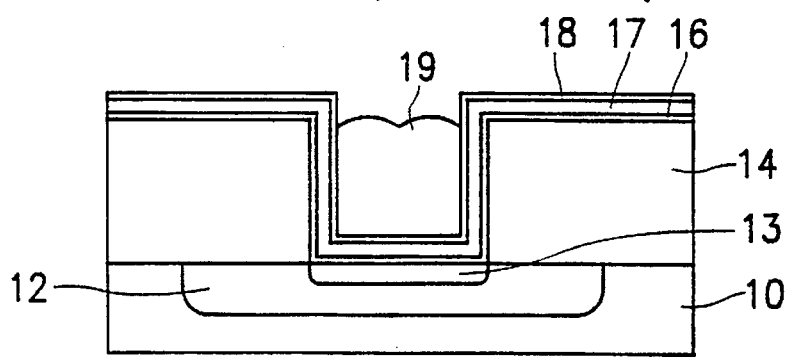
Figure 1D:
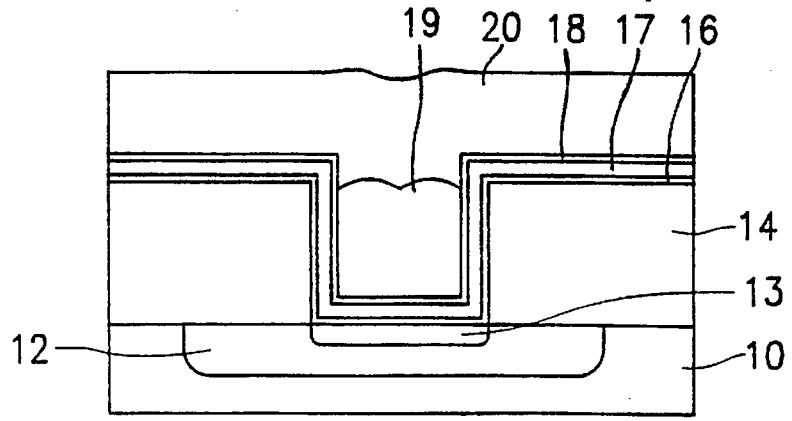
Figure 2A:
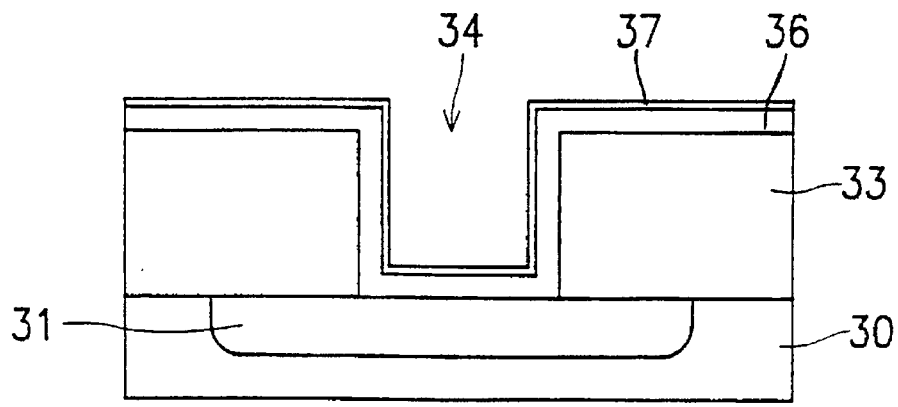
FIGS. 2A through 2E illustrate, in cross-section, process steps in accordance with one embodiment of the present invention.

FIGS. 2A–2E illustrate a planar electrical contact which has been formed on a silicon substrate 30 according to the principles of the invention. Referring specifically to FIG. 2A, a number of device or doped regions 31 (only one doped region is shown in the figures) are formed in the upper surface of silicon substrate 30 or in an epitaxial layer above the silicon substrate (not shown) Oxide regions may also be formed to isolate one doped region from another (not shown). Once the doped regions have been defined by various steps of masking, etching, doping, oxide formation, and so on, metal connections between the doped regions and a conductive path to external circuitry are formed. The metal connections are preceded by the formation of a dielectric layer 33 which covers field oxide and all underlying conductive regions, such as polysilicon and source/drain regions Dielectric layer 33 functions as an insulating layer, and is preferably a silicon dioxide doped with phosphorus, boron/phosphorus or arsenic Dielectric layer 33 is formed by conventional processes to a typical thickness employed in the semiconductor art.

Dielectric layer 33 is patterned and etched down to a portion of doped region 31 to form a contact hole 34. A thin layer of polysilicon 36 is then formed by chemical vapor deposition over the dielectric layer and in contact hole 34 to ensure good adhesion and electrical contact between subsequent layers and the underlying doped region 31. The thickness of the polysilicon layer 36 is preferably about 800 Å to 1200 Å and more preferably about 1000 Å.

A metal layer 37, preferably titanium, is deposited over polysilicon layer 36. Titanium layer 37 is deposited by sputtering from a titanium target in an inert gas atmosphere, such as argon. The titanium layer is preferably thick enough to adequately cover the bottom of contact hole 34. On the other hand, if titanium layer 37 is too thick, in the subsequent thermal annealing process in which titanium reacts with polysilicon to form titanium silicide (discussed below), unconsumed titanium is oxidized to titanium oxide and formed in the contact hole, resulting in increased contact resistance. Accordingly, titanium layer 37 is preferably about 400 Å–600 Å and more preferably about 500 Å.

Figure 2B:
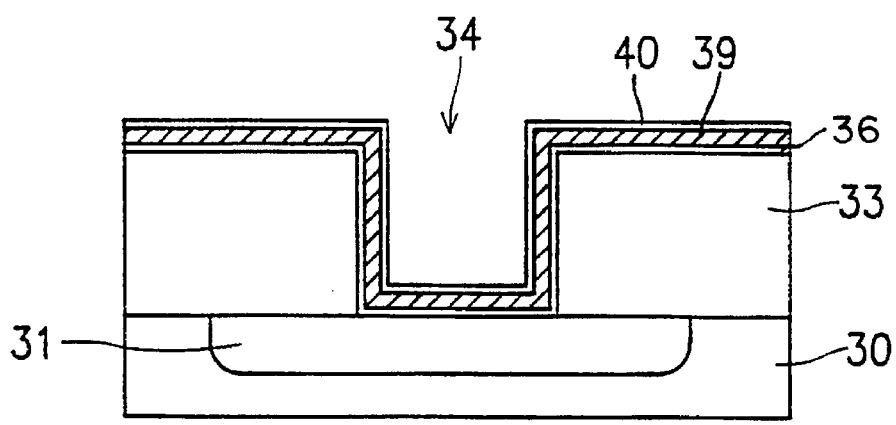

Referring to FIG. 2B, the structure as shown in FIG. 2A is then subjected to rapid thermal annealing to form a titanium silicide layer 39 at the titanium polysilicon interface and a titanium nitride layer 40 on top of the titanium layer. This step is preferably accomplished by annealing the structure in nitrogen or a nitrogen containing atmosphere, such as ammonia, between about 650° C. and 800° C. for about 30 seconds. During the heat treatment, the titanium is completely consumed by reacting with nitrogen and polysilicon. Titanium nitride layer 40 acts as a barrier layer which prevents the diffusion of doped species and/or silicon from silicon substrate 30 to any conducting materials that will be formed over the barrier layer 40. Titanium nitride layer 40 also functions as an adhesion media for conducting materials, such as Al/Si/Cu (discussed below). The thickness of titanium nitride layer 40 is preferably between about 250 Å and 2000 Å. Most metal silicides generally have a relatively low electrical resistance and, therefore, titanium silicide layer 39 serves to reduce the contact resistance through contact hole 34.

Figure 2C:
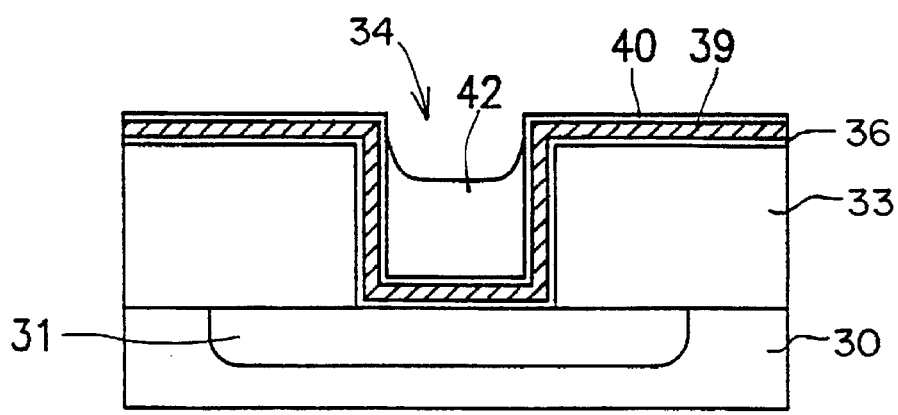

Referring now to FIG. 2C, after the rapid thermal processing, a layer of plug materials, such as a layer of spin-on-glass (SOG), is deposited over the doped region and into contact hole 34. The SOG layer is then preferably processed by a three-stage hot plat baking, i.e., baked sequentially at temperatures of about 100° C., 200° C. and 300° C., and then cured at a temperature of about 400°–450° C. In order to expose titanium nitride layer 40 for connection with a conducting material, the SOG layer deposited over titanium nitride layer 40 is removed, leaving only SOG plug 42 filled in contact hole 34. The removal of the SOG layer is performed by a conventional etching process, such as a wet or dry oxide etching process that will prevent over-etching into SOG plug 42.

Figure 2D:
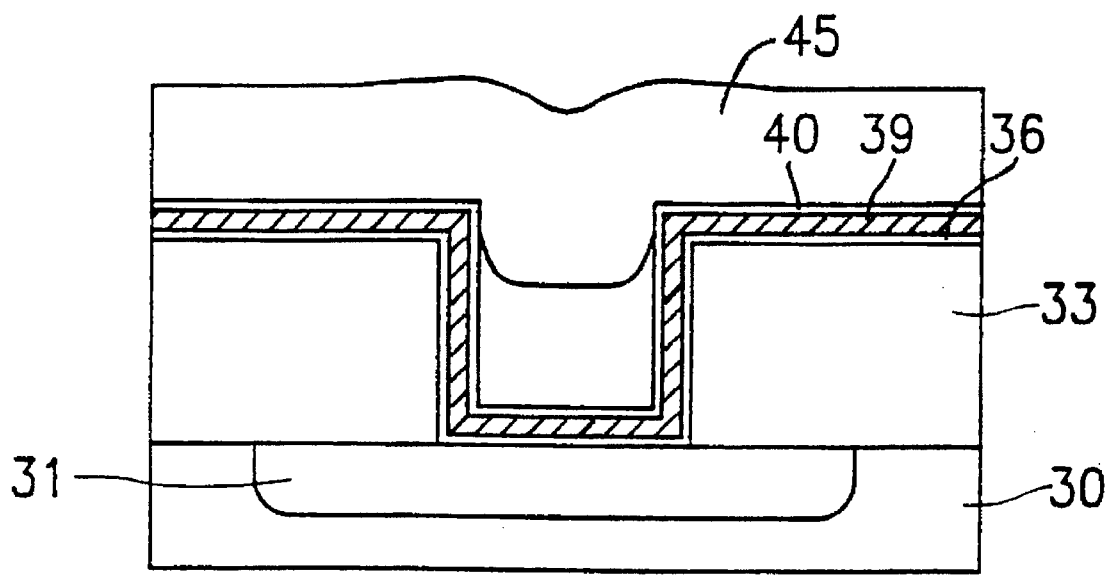

Referring to FIG. 2D, a conducting layer 45, such as aluminum, is then sputtered to the surface of the structure shown in FIG. 2C to interconnect with titanium nitride layer 40. Since contact hole 34 is filled with SOG plug 42, very little of the sputtered aluminum layer 45 will sink into contact hole 34, which results in a substantially planar top surface.

Figure 2E:
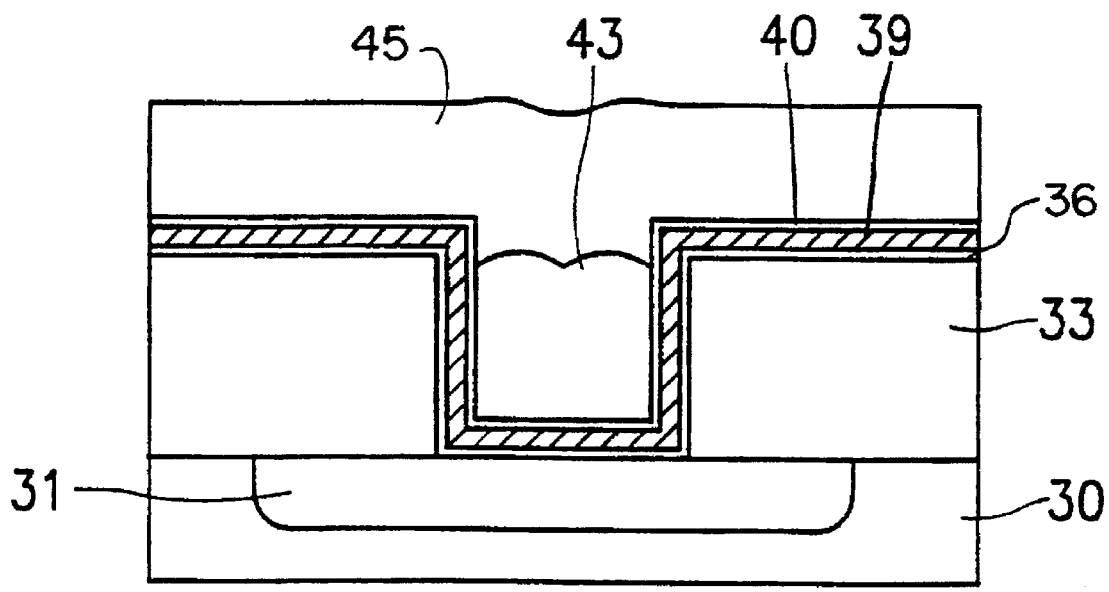

It should be noted that the invention is not limited to SOG for plugging contact hole 34. For example, a polysilicon layer can be deposited over the doped region and filled in contact hole 34 after a rapid thermal process. The etching process of the polysilicon layer is preferably a conventional silicon etching technique well known to those skilled in this art. The final structure, using a polysilicon layer as plug material, is shown in FIG. 2E, in which a polysilicon plug 43 is provided for contact planarization, thus preventing the step coverage problem of conducting layer 45. Of course, other known materials that can be conformally deposited on the device surface and then etched around contact hole 34 may be used as plug material, such as polyimide. However, it has been found that the planarization effect and process simplicity of SOG and polysilicon are superior to most other materials.

FIGS. 3A through 3E illustrate a planar contact which has been formed on a silicon substrate according to another embodiment of the invention. In this embodiment, a barrier layer is deposited upon a metal layer prior to the annealing process for forming metal silicide.

Figure 3A:
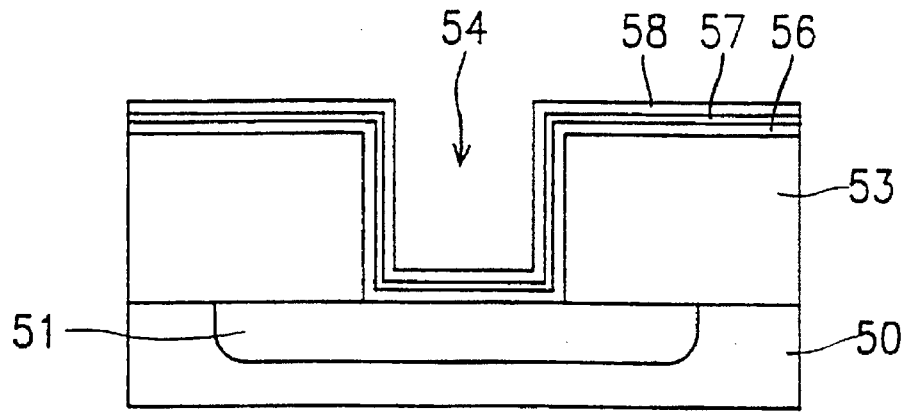
FIGS. 3A through 3E illustrate, in cross-section, process steps in accordance with an alternative embodiment of the present invention.

Referring to FIG. 3A, after forming contact hole 54 through insulating layer 53 to doped region 51 in silicon substrate 50, three layers; i.e., a polysilicon layer 56, a titanium layer 57 and a barrier layer 58, are subsequently formed to cover doped region 51. Polysilicon layer 56 is formed by chemical vapor deposition to directly contact doped region 51. Titanium layer 57 is formed on polysilicon layer 56 by sputtering, and barrier layer 58, preferably a titanium nitride layer, is formed to cover the surface of contact hole 34 by deposition. Preferably, polysilicon layer 56, titanium layer 57, and barrier layer 58 have thicknesses between about 500 Å and 1000 Å, about 500 Å, and between about 500 Å and 1000 Å, respectively.

Figure 3B:
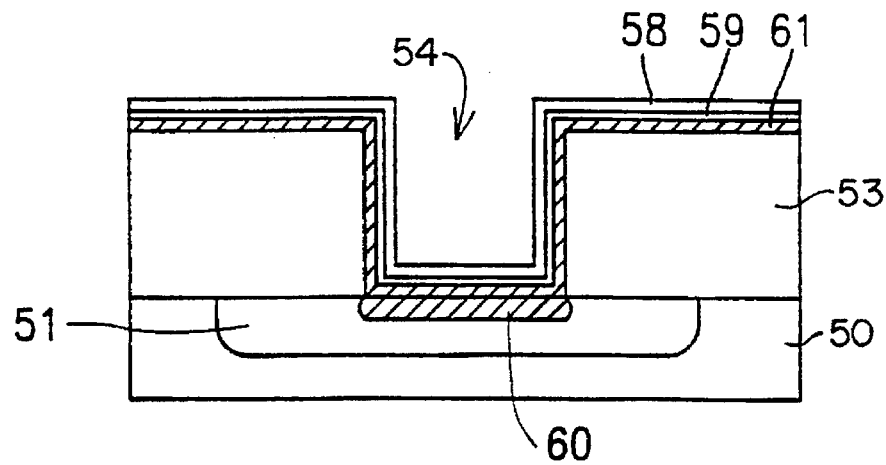

Referring to FIG. 3B, a titanium silicide layer 61 is formed at the titanium polysilicon interface by rapid thermal annealing. The rapid thermal annealing process is performed, for example, by heating the structure in an ammonia gas atmosphere between 650° C. and 800° C. for about 30 seconds. It should be noted that, in this embodiment, since barrier layer 58 prevents titanium layer 57 from reacting with the nitrogen atmosphere, a portion of polysilicon layer 56 at the bottom of contact hole 54 is completely consumed by the titanium layer 57. Thus, excessive titanium reacts with silicon substrate 50 to form a second titanium silicide layer 60 at the surface of doped region 51. The formation of titanium silicide 60 will further reduce the electrical contact resistance of doped region 51.

Figure 3C:
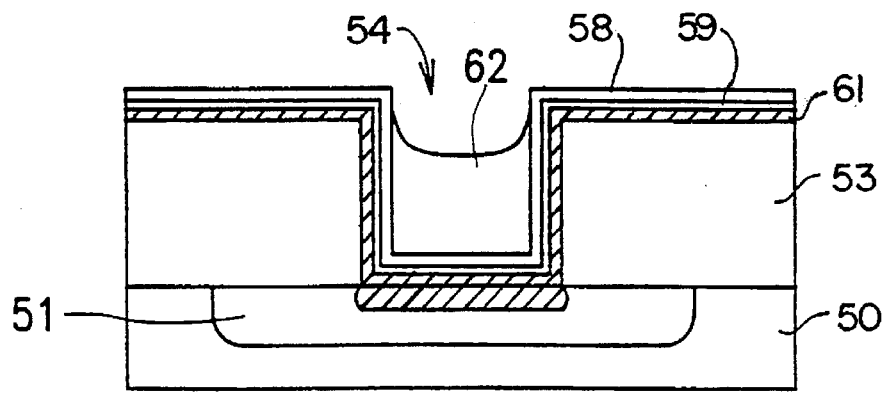
Figure 3D:
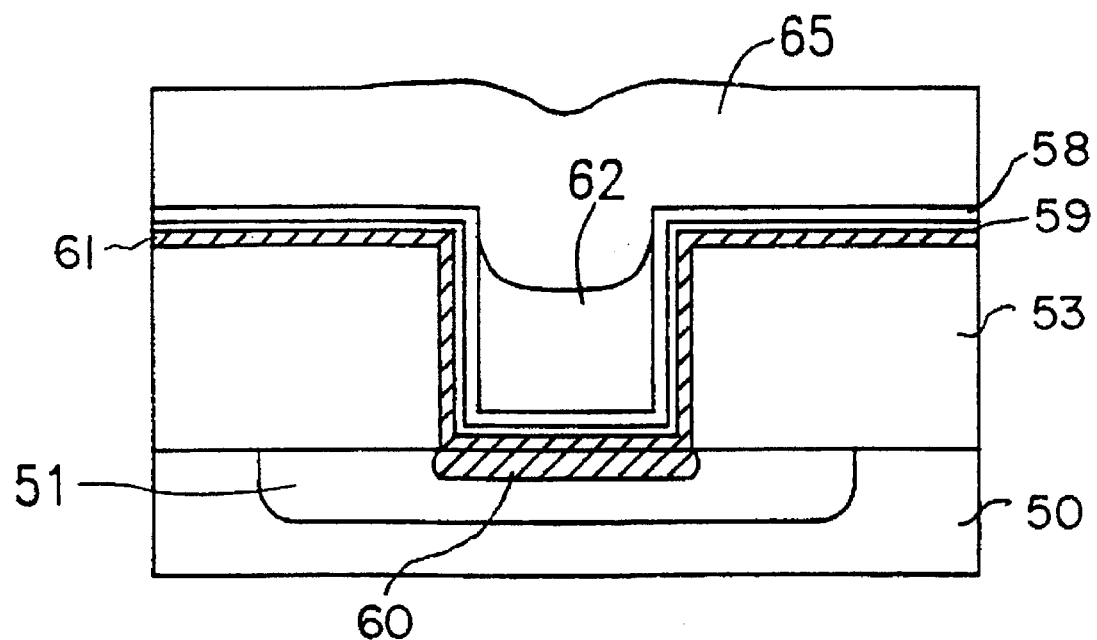
Figure 3E:
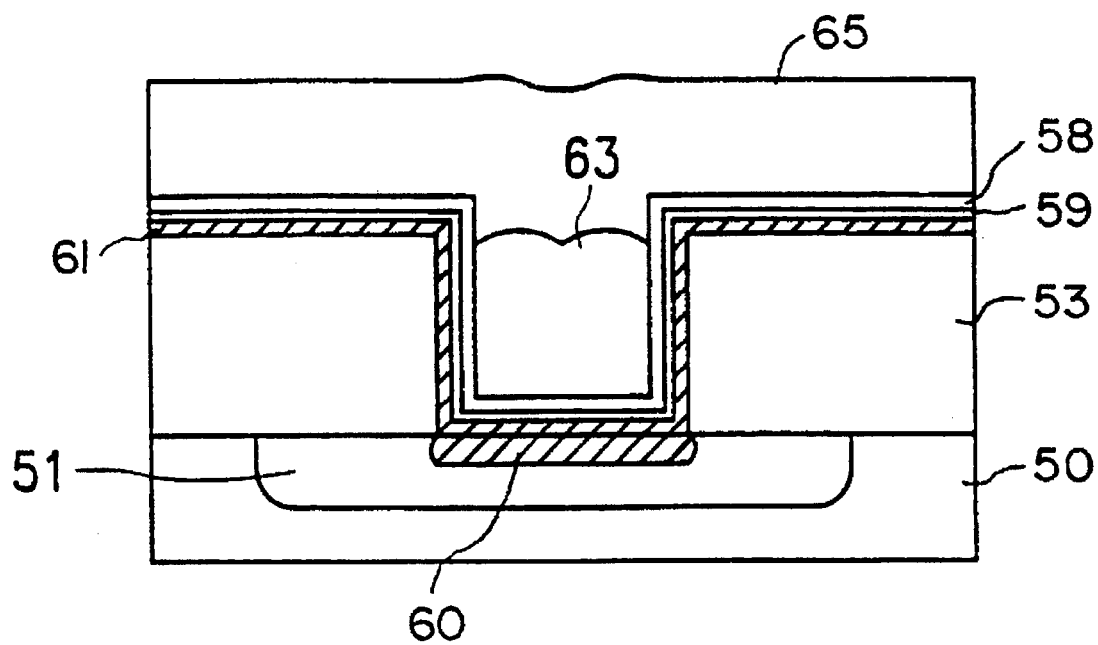

Referring to FIG. 3C, a plug 62 of material, such as SOG or polysilicon, is filled into contact hole 54. The deposition and etching process of the plug material is the same as that of the previous embodiment. After the contact hole is substantially filled, a conducting layer 65 is sputtered to cover the structure, as shown in FIG. 3D. FIG. 3E illustrates an alternative device structure which is formed according to this embodiment by using other plug materials 63; for example, polysilicon or polyimide.

What is claimed is:

1. A method of planarizing an electrical contact region in a semiconductor device comprising the steps of:

providing a substrate having a surface and a doped region on said surface;

forming an insulating layer over said surface of said substrate, said insulating layer covering substantially the entire doped region;

forming a hole through said insulating layer to expose at least a portion of said doped region;

filling a substantial portion of said hole with a material selected from the group consisting of spin-on-glass and polysilicon; and forming a conducting layer over said insulating layer and said material in said hole;

before the filling step, forming a polysilicon layer over said insulating layer, a portion of said polysilicon layer extending onto said exposed portion of said doped region;

forming a metal layer over said polysilicon layer;

forming a barrier layer over said metal layer; and thermally annealing said polysilicon layer and said metal layer to form a first metal silicide layer on said insulating layer and a second metal silicide layer on a surface of said doped region.

2. The method of claim 1 wherein said filling step comprises:

forming a filling layer with said material, said filling layer having a first portion overlying said insulating layer and a second portion within said hole, said second portion of said filling layer having a thickness sufficient to substantially fill said hole; and etching said filling layer so that said first portion is substantially removed from said insulating layer and said second portion substantially remains within said hole.

3. The method of claim 2 wherein said thickness of said filling layer within said hole remains substantially constant during said etching step.

4. The method of claim 2 wherein said etching step comprises a wet etching process.

5. The method of claim 2 wherein said etching step comprises a dry etching process.

6. The method of claim 2 wherein the step of forming said filling layer comprises:

depositing a layer of spin-on-glass over said insulating layer and into said hole;

three-stage hot plate baking said layer of spin-on-glass at about 100° C., 200° C. and 300° C.; and curing said layer of spin-on-glass at about 400° C.–450° C.

7. The method of claim 1 further including the steps of:

before the filling step, forming a polysilicon layer over said insulating layer, a portion of said polysilicon layer extending onto said exposed portion of said doped region;

forming a metal layer over said polysilicon layer; and thermally annealing said polysilicon layer and said metal layer in a nitrogen containing atmosphere to form a metal nitride layer and a metal silicide layer under Said metal nitride layer.

8. The method of claim 7 wherein the metal layer is titanium.

9. The method of claim 1 wherein said metal layer is titanium.

10. A method of planarizing an electrical contact region on a silicon substrate comprising the steps of:

forming a doped region at the surface of said substrate;

forming an insulating layer over said surface;

forming an opening through said insulating layer to expose a portion of said doped region;

forming a polysilicon layer over said insulating layer, a portion of said polysilicon layer extending onto said portion of said doped region;

forming a titanium layer over said polysilicon layer;

thermally annealing said polysilicon layer and said titanium layer in a nitrogen containing atmosphere to form a titanium nitride layer and a titanium silicide layer under said titanium nitride layer, said thermally annealing step comprises heating said polysilicon layer and said titanium layer in an ammonia gas atmosphere between 650° C. and 800° C. for about 3.0 seconds;

filling said opening with a material selected from the group consisting of spin-on-glass and polysilicon;

forming a conducting layer to cover said titanium nitride layer and at least a portion of said filled opening.

11. The method of claim 10 wherein said titanium nitride layer has a first portion within said opening of said insulating layer and a second portion surrounding said opening, the filling step including the steps of:

forming a filling layer with said material over said titanium nitride layer, said filling layer having a thickness sufficient to substantially fill said opening in said insulating layer; and etching said filling layer to expose said second portion of said titanium nitride layer without exposing said first portion of said titanium nitride layer.

12. The method of claim 10 wherein said filling layer is a layer of spin-on-glass.

13. The method of claim 10 wherein said filling layer is a layer of polysilicon.

14. The method of claim 10 wherein said polysilicon layer has a thickness of about 1000 Å.

15. The method of claim 10 wherein said titanium layer has a thickness of about 500 Å.

16. A method of planarizing a contact region on a silicon substrate comprising the steps of:

forming a doped region at the surface of said substrate;

forming an insulating layer over said surface;

forming an opening through said insulating layer to expose a portion of said doped region;

forming a polysilicon layer over said insulating layer, a portion of said polysilicon layer extending onto said portion of said doped region;

forming a titanium layer over said polysilicon layer;

forming a barrier layer over said titanium layer;

thermally annealing said titanium layer and said polysilicon layer to form a titanium silicide layer on said insulating layer;

filling at least a portion of said opening with a material selected from the group consisting of spin-on-glass and polysilicon; and forming a conducting layer to cover said barrier layer and said filled opening, said barrier layer having a first portion within said opening of said insulating layer and a second portion surrounding said opening, the filling step comprising:

forming a filling layer with said material over said barrier layer, said filling layer having a thickness sufficient to substantially fill said opening in said insulating layer; and oxide etching said filling layer to expose said second portion of said barrier layer without exposing said first portion of said barrier layer.

17. The method of claim 16 wherein said filling layer is a layer of spin-on-glass.

18. The method of claim 16 wherein said filling layer is a layer of polysilicon.

19. The method of claim 16 wherein said thermal annealing step comprises heating said titanium layer and said polysilicon layer in an ammonia gas atmosphere between 650° C. and 800° C. for about 30 seconds.

20. The method of claim 16 wherein said polysilicon layer has a thickness of about 500 Å to 1000 Å.

21. The method of claim 16 wherein said titanium layer has a thickness of about 500 Å.

22. The method of claim 16 wherein said barrier layer is a titanium nitride layer having a thickness of about 500 Å to 1000 Å.

* * * * *